(12) United States Patent
Ryoo et al.

(10) Patent No.: US 7,453,111 B2
(45) Date of Patent: Nov. 18, 2008

(54) PHASE-CHANGE MEMORY DEVICE

(75) Inventors: Kyung-Chang Ryoo, Seongnam-si (KR); Ju-Chul Park, Suwon-si (KR); Se-Ahn Song, Gangnam-gu (KR); Yoon-Jong Song, Seocho-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 17 days.

(21) Appl. No.: 11/754,437

(22) Filed: May 29, 2007

(65) Prior Publication Data
US 2007/0284622 A1     Dec. 13, 2007

(30) Foreign Application Priority Data
May 26, 2006    (KR) .................. 10-2006-0047643

(51) Int. Cl.
*H01L 27/108*    (2006.01)
(52) U.S. Cl. ........................ 257/295; 257/296
(58) Field of Classification Search ............ 257/734, 257/295, 296
See application file for complete search history.

(56) References Cited

U.S. PATENT DOCUMENTS

| 5,825,046 | A | 10/1998 | Czubatyj et al. |
| 6,329,666 | B1 | 12/2001 | Doan et al. |
| 6,507,061 | B1 * | 1/2003 | Hudgens et al. ............. 257/295 |
| 6,569,705 | B2 | 5/2003 | Chiang et al. |
| 6,586,761 | B2 | 7/2003 | Lowrey |
| 6,855,975 | B2 | 2/2005 | Gilton |
| 7,038,261 | B2 * | 5/2006 | Horii .......................... 257/295 |

FOREIGN PATENT DOCUMENTS

| KR | 1020030086820 A | 11/2003 |
| KR | 1020050055400 | 6/2005 |

* cited by examiner

*Primary Examiner*—Roy K Potter
(74) *Attorney, Agent, or Firm*—Volentine & Whitt, PLLC

(57) ABSTRACT

Disclosed is a phase-change memory device including a phase-change material pattern, a diffusion barrier layer, a bottom electrode and a top electrode. The phase-change material pattern is placed on the bottom electrode, and the diffusion barrier layer containing tellurium is placed on the phase-change material pattern. The top electrode containing titanium is placed on the diffusion barrier layer. The diffusion barrier layer acts to inhibit diffusion of titanium from the top electrode into the phase-change material pattern.

13 Claims, 14 Drawing Sheets

PHASE-CHANGE MEMORY DEVICE

CROSS-REFERENCE TO RELATED APPLICATION

This application claims priority under 35 U.S.C. § 119 to Korean Patent Application No. 2006-47643 filed on May 26, 2006, the subject matter of which is hereby incorporated by reference.

BACKGROUND OF THE INVENTION

1. Field of the Invention

The present invention relates to semiconductor devices and more particularly to a phase-change memory device.

2. Description of the Related Art

Ongoing developments in electronic devices such as mobile telephones, personal media players, and computers, result in an increasing demand for semiconductor memory devices characterized by a high operating frequency, greater integration density, nonvolatile data storage, and low power consumption. By many measures, this constellation of demands remains unmet by contemporary memory devices, (e.g., dynamic random access memories (DRAMs), static random access memories (SRAMs), flash memories, etc.).

For instance, DRAMs and SRAMs provide only volatile data storage that requires maintenance of constant power. It has also proved difficult to increase the integration density of SRAMs because each constituent memory cell is formed from six (6) transistors. Contemporary flash memory devices, while nonvolatile in their data storage, are relatively slow in their operating frequency.

As a result of these ongoing deficiencies, phase-change random access memories (PRAMs) have become a subject of intense research and development, because in theory they offer the combination of low power consumption, high operating frequencies, and nonvolatile memory storage.

PRAMs are memory devices using one or more phase-change materials. This material acts as a variable resistor within the data storage element of a PRAM. In one view, PRAMs may be formed very much like conventional DRAMs save the dielectric material used to form the DRAM capacitor is replaced with a phase-change material. The resistance of common phase-change materials varies with a "phase" or state of the material. For example, a phase-change material may have a higher resistivity in a crystalline phase as compared with an amorphous phase. By sensing variations in a voltage and/or a current dictated by this variable resistance, it is possible to differentiate data states (e.g., logical values of '1' or '0'). One promising phase-change material is formed with a chalcogenide containing germanium (Ge), antimony (Sb), and tellurium (Te).

FIG. 1 is a sectional schematic illustrating a general structure of a PRAM. Referring to FIG. 1, a phase-change material pattern 40 and a top electrode 45 are sequentially stacked on a semiconductor substrate 10 including a bottom electrode. The top electrode 45 is electrically connected to an interconnection 80 through a bottom electrode contact 75 penetrating an interlevel (or interlayer) insulation layer 70.

The phase-change material pattern 40 has a phase-change region "P" that transforms into an amorphous phase or a crystalline phase under the influence of applied thermal energy. The phase-change region P is formed within the phase-change material pattern 40 in contact with a bottom electrode 35.

While write and read operations proceed in the illustrated PRAM, titanium atoms (e.g., from top electrode 45) are diffused into the phase-change material pattern 40. Such diffusion of titanium atoms varies a defined composition ratio for the components forming the phase-change material pattern 40. In particular, if the titanium atoms diffuse into the phase-change region P, the PRAM will be unable to continue proper operation. This possible result is further explained in the graphs of FIGS. 2A, 2B and 2C.

FIGS. 2A, 2B, and 2C are graphs showing relative quantities of titanium as a function of position and illustrate the effect of titanium diffusion within a phase-change memory device. FIG. 2A illustrates conditions that exist within the exemplary PRAM upon initial operation. FIG. 2B illustrates conditions that exist following repeated execution of write and read operations in the PRAM. FIG. 2C illustrates conditions that exist when the exemplary PRAM has reached the end of operational lifespan. The horizontal axes in these graphs indicate relative diffusion positions between points "A" and "B" in the phase-change material of FIG. 1. In one example corresponding to the graphs of FIGS. 2A, 2B and 2C, 50 nm position is located in an upper part of the phase-change material pattern 40 near the top electrode 45 and the 100 nm position is located in a lower part of the phase-change material pattern 40 near the bottom electrode 35. The vertical axes of these graphs indicate relative quantities of materials existing at their corresponding positions in the phase-change material pattern.

Referring to FIG. 2A, before initiating read/write operations in the PRAM, the relative concentration of titanium atoms within the phase-change material 40 is small. In contrast and as illustrated in FIG. 2B, this concentration increases with repeated execution read/write operations in the PRAM as titanium atoms migrate from the top electrode 45 into the phase-change material pattern 40. Of note, the concentration of titanium atoms increases in the upper part of the phase-change material 40, but the lower part of the phase-change material 40 remains relatively free of diffused titanium atoms. Referring now to FIG. 2C, at the end of the operational lifespan of the PRAM, the concentration of diffused titanium atoms actually falls in the upper part of the phase-change material 40, but markedly increases in the phase-change region P. Thus, as illustrated by the example shown in FIGS. 2A, 2B and 2C, during operation of conventional PRAMs, titanium atoms tend to diffuse from an electrode into a phase-change region. At higher concentrations of titanium atoms within the phase-change region, the performance capabilities and overall reliability of the PRAM become impaired.

SUMMARY OF THE INVENTION

Embodiments of the present invention provide a phase-change memory device having improved reliability and performance characteristics.

In one embodiment, the invention provides a phase-change memory device comprising; a phase-change material pattern, first and second electrodes providing an electrical signal to the phase-change material pattern, and a diffusion barrier layer comprising tellurium and contacting the first electrode to thereby inhibiting atomic diffusion from the first electrode into the phase-change material pattern.

In another embodiment, the invention provides a phase-change memory device comprising; a bottom electrode in a semiconductor substrate, a phase-change material pattern on the bottom electrode, a first diffusion barrier layer comprising tellurium on the phase-change material pattern, and a top electrode comprising titanium on the first diffusion barrier layer, wherein the first diffusion barrier layer inhibits diffusion of titanium from the top electrode into the phase-change material pattern.

In another embodiment, the invention provides a phase-change memory device comprising; a bottom electrode in a semiconductor substrate, a phase-change material pattern on the bottom electrode, a top electrode comprising titanium on the phase-change material pattern, and a diffusion barrier layer comprising tellurium on the top electrode, wherein the diffusion barrier layer inhibits diffusion of titanium from the top electrode into the phase-change material pattern.

DESCRIPTION OF EMBODIMENTS

Figure 1:
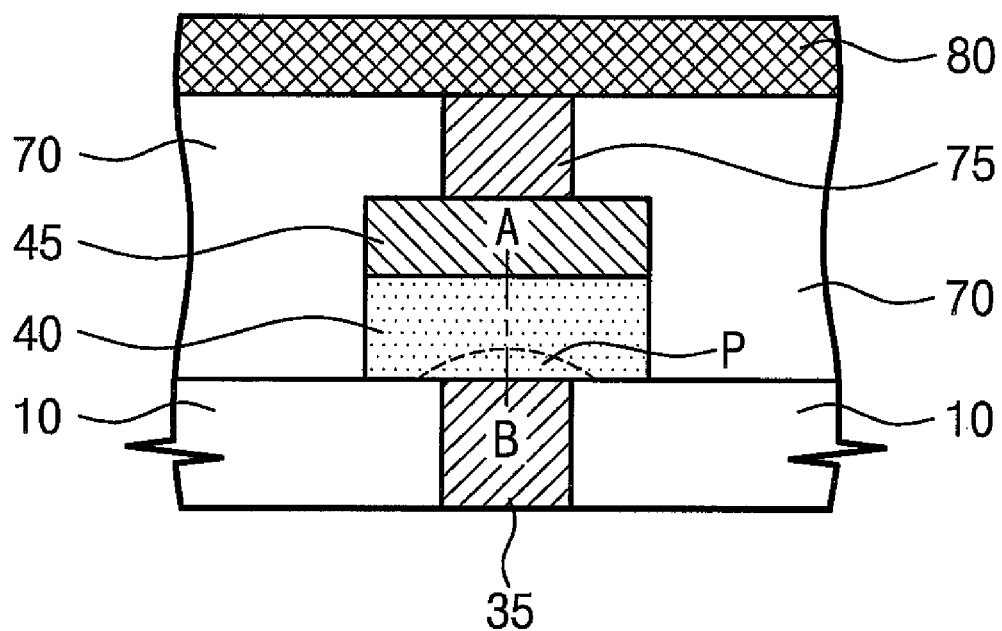
FIG. 1 is a sectional schematic illustrating a general structure of a phase-change memory device.
Figure 2A:
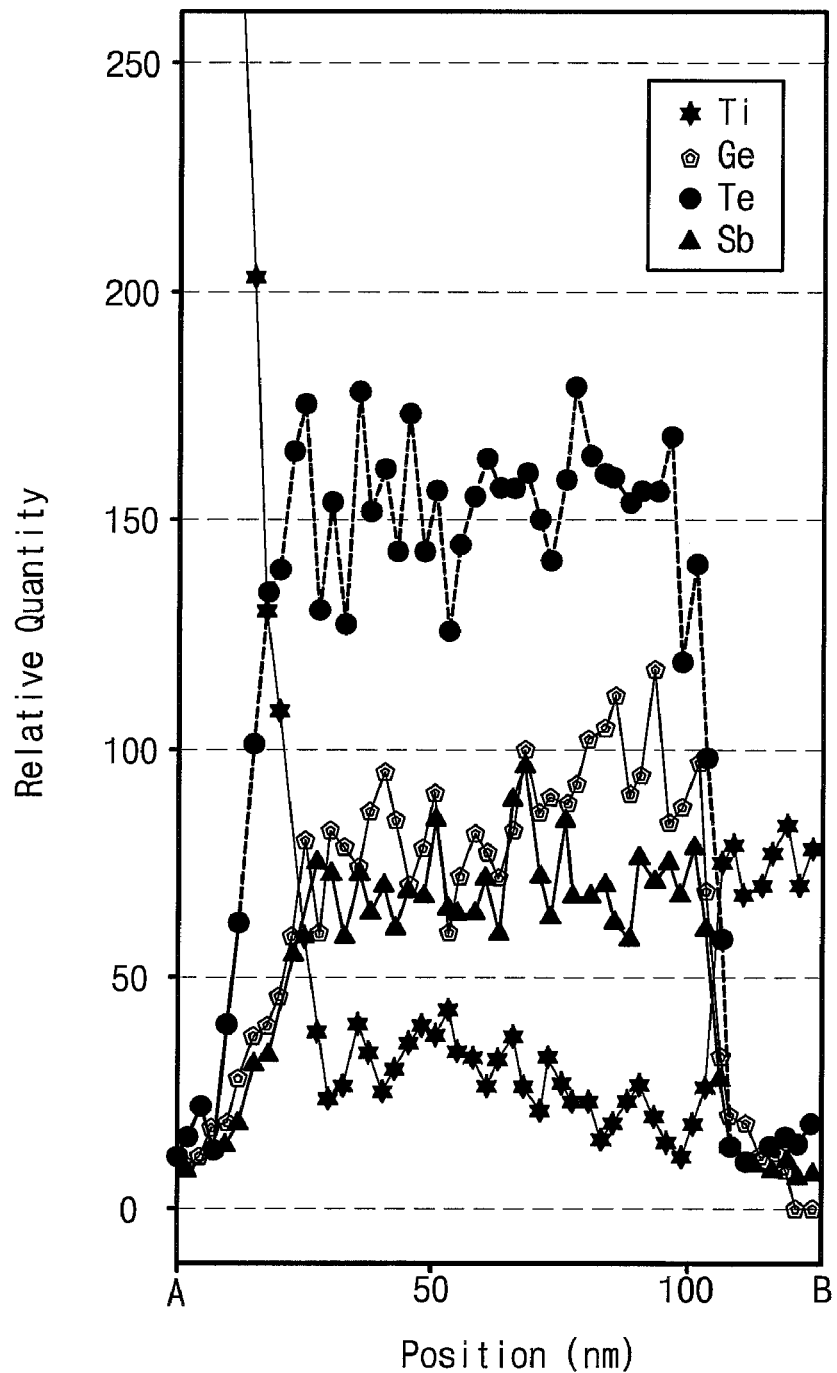
FIGS. 2A through 2C are graphic views showing relative quantities of titanium in accordance with positions, explaining an effect of titanic diffusion in a phase-change memory device.
Figure 2B:
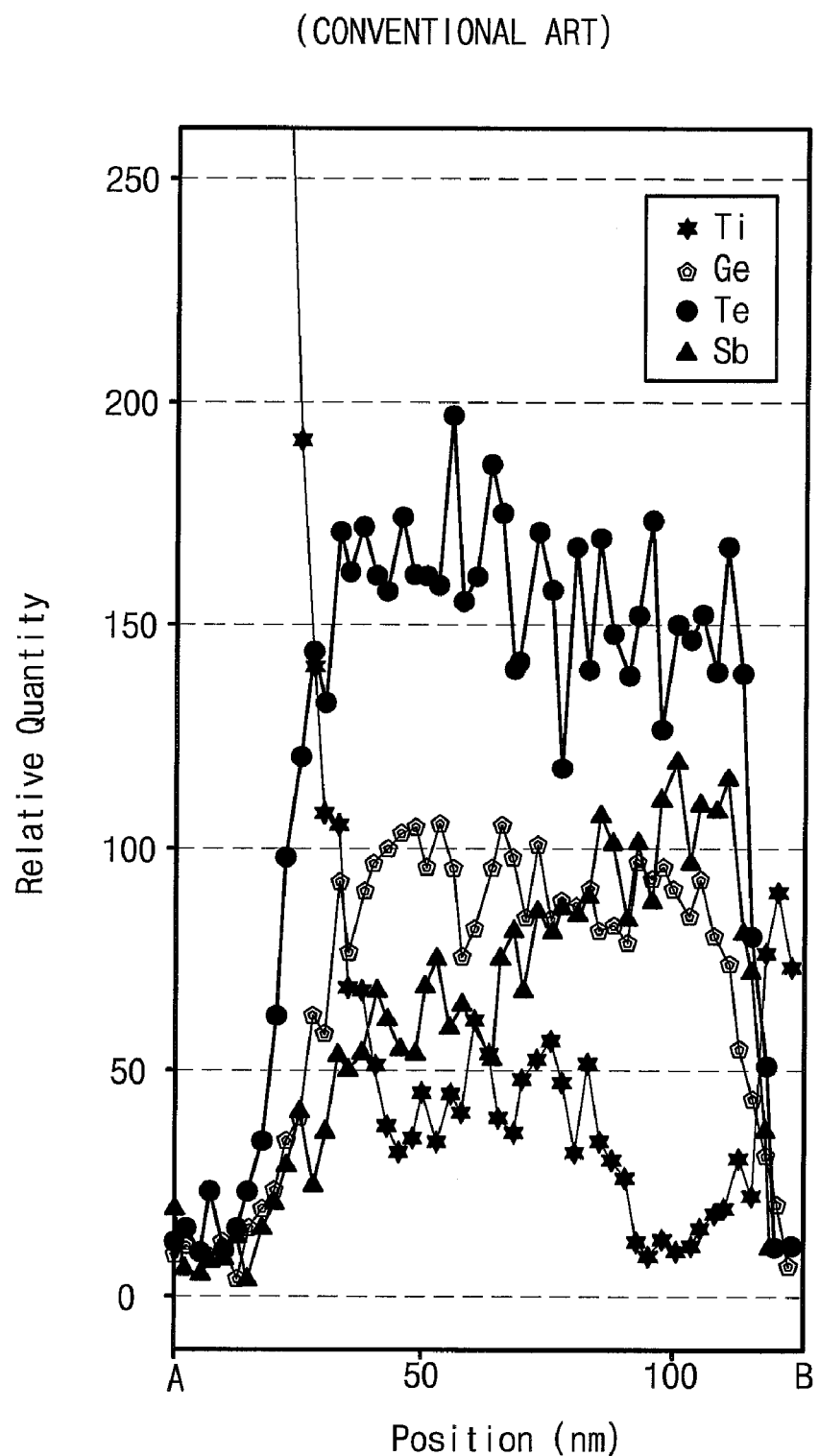
Figure 2C:
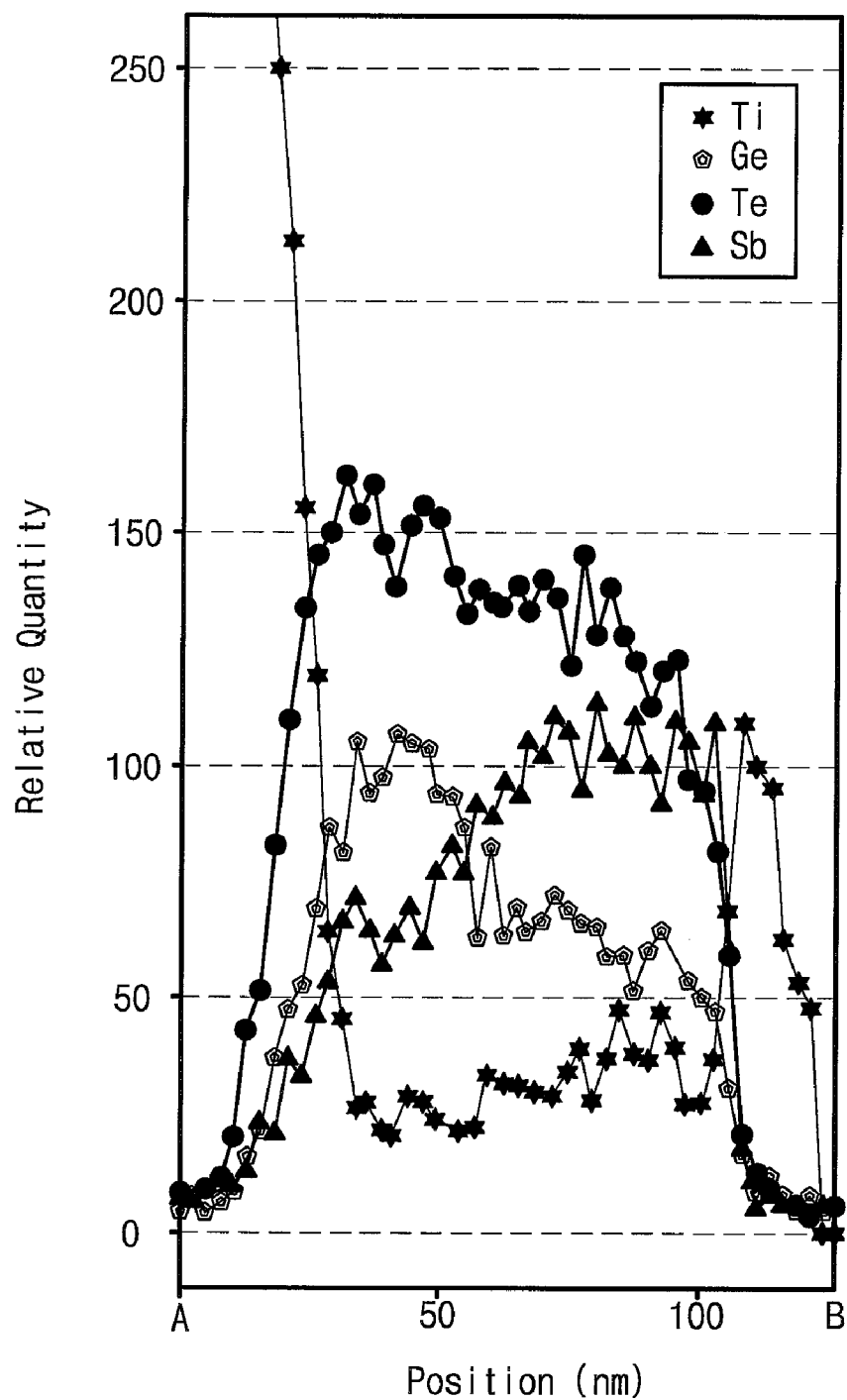

Embodiments of the invention will now be described in some additional detail with reference to the accompanying drawings. The present invention may, however, be embodied in many different forms and should not be construed as being limited to only the illustrated embodiments. Rather, the embodiments are presented as teaching examples.

In the figures, the dimensions of layers and regions are exaggerated for clarity of illustration. It will also be understood that when a layer is said to be 'on' another layer or substrate, it can be directly on the other layer or substrate, or intervening layers may also be present. Further, it will be understood that when a layer is said to be 'under' another layer, it can be directly under, or one or more intervening layers may be present. In addition, it will also be understood that when a layer is said to be 'between' two layers, it can be the only layer between the two layers, or one or more intervening layers may also be present.

Moreover, within the description that follows, terms such as first, second, or third are employed to merely differentiate various elements. No artificial ordering or limiting relationship is indicated or implied by such terms. Throughout the written description and drawings like reference numerals refer to like or similar elements.

FIGS. 3A through 7B are sectional views illustrating phase-change memory devices in accordance with embodiments of the invention.

Figure 3A:
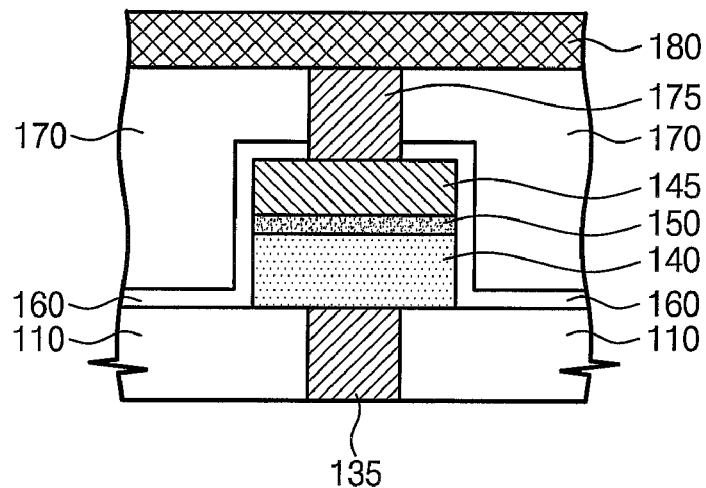
FIGS. 3A through 7B are sectional views illustrating phase-change memory devices in accordance with embodiments of the present invention.

Referring to FIG. 3A, on a semiconductor substrate 110 including a conductor 135 are stacked a phase-change material pattern 140, a diffusion barrier layer 150, and a top electrode 145 in sequence. The conductor 135 may be a bottom electrode or a bottom electrode contact for connecting the phase-change material pattern 140 to the bottom electrode. The phase-change material pattern 140 may comprise germanium (Ge), antimony (Sb), and tellurium (Te). For example, the phase-change material pattern 140 may comprise $Ge_2Sb_2Te_5$.

The diffusion barrier layer 150 may comprise tellurium (Te), and the top electrode 145 may comprise titanium (Ti). For example, the diffusion barrier layer 150 may comprise $TiTe_2$, and the top electrode 145 may comprise at least one of Ti, TiN, TiSiN, TiAlN, TiBN, TiON, and TiAlON. Since tellurium (Te) included in the diffusion barrier layer 150 is highly attractive to titanium (Ti), it is able to inhibit or materially prevent diffusion of titanium atoms from the top electrode 145.

A passivation layer 160 is provided on sidewalls of the phase-change material pattern 140. The passivation layer 160 may comprise silicon nitride and function to protect the phase-change material pattern 140. For example, the passivation layer 160 may inhibit oxygen from diffusing into the phase-change material pattern 140.

A top electrode contact 175 penetrating an interlevel insulation layer 170 is formed on the top electrode 145. An interconnection 180 is placed on the interlevel insulation layer 170 including the top electrode contact 175. The interconnection 180 is electrically connected to the top electrode 145 through the top electrode contact 175.

The top electrode 145 and the bottom electrode provide an electrical signal to the phase-change material pattern 140. This electrical signal is activated during PRAM read/write operations. For instance, a crystalline phase for the phase-change material pattern 140 having a relatively low electrical resistance may be changed into an amorphous phase having a relatively high resistance in response to the applied electrical signal during a read/write operation. In effect, the data is written or read, and its logical state (e.g., '1' or '0') determined in accordance with the resistance of the phase-change material.

In addition, the top electrode 145 functions as a barrier to inhibit (i.e., materially prevent) reaction between the top electrode contact 175 and the phase-change material pattern 140.

In this embodiment, as the diffusion barrier layer 150 is interposed between the top electrode 145 and the phase-change material pattern 140, it is able to inhibit titanium atoms from the top electrode 145 from diffusing into the phase-change material pattern 140 even after numerous read/write operations have been performed. Thus, the composition of materials forming the phase-change material pattern 140 are maintained at a relatively constant ratio. This improves reliability and the life-cycle operating characteristics of the phase-change memory device.

Figure 3B:
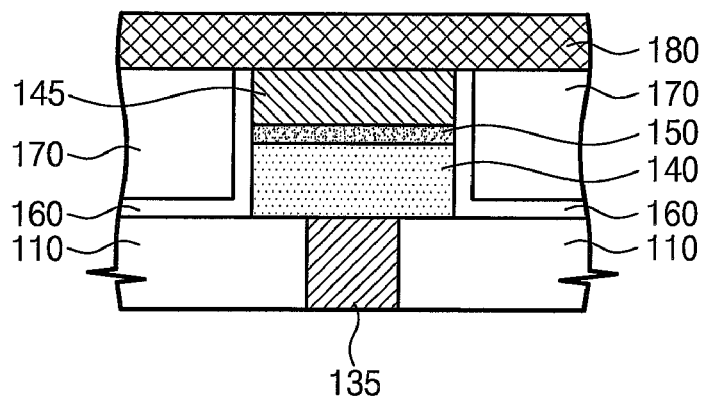

Referring to FIG. 3B, the top electrode 145 is connected to the interconnection 180 in a form different from the example shown in FIG. 3A. As illustrated in FIG. 3B, the interconnection 180 directly contacts with the top electrode 145 without the requirement for top electrode contact 175. This configuration allows a reduction in the contact resistance.

Figure 4A:
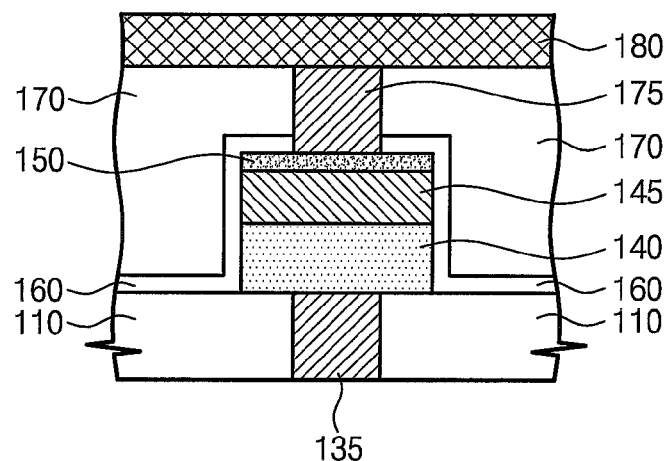
Figure 4B:
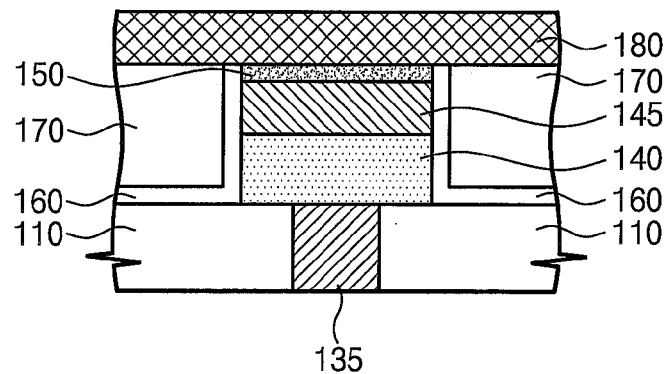

Referring to FIGS. 4A and 4B, different from the former embodiment, the diffusion barrier layer 150 is placed on the top electrode 145. Tellurium atoms included in the diffusion barrier layer 150 strongly combine with titanium atoms, so that the titanium atoms of the top electrode 145 are nonetheless inhibited from diffusing into the phase-change material pattern 140 although the diffusion barrier layer 150 is located on the top electrode 145.

Figure 5A:
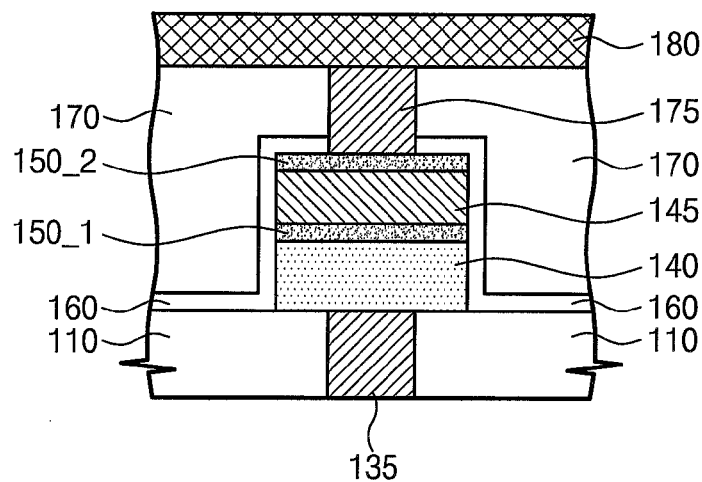
Figure 5B:
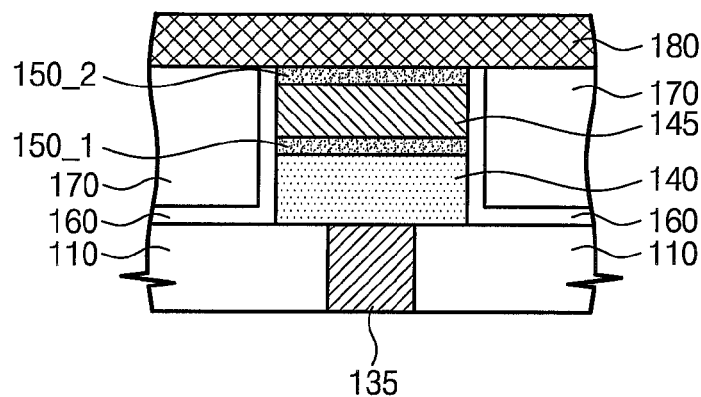

Referring to FIGS. 5A and 5B, two diffusion barrier layers 150_1 and 150_2 are placed respectively on and under the top electrode 145. The first diffusion barrier layer 150_1 is interposed between the phase-change material pattern 140 and the top electrode 145, while the second diffusion barrier layer 150_2 is laid on the top electrode 145.

In this embodiment, since the diffusion barrier layers, 150_1 and 150_2, are placed on and under the top electrode 145, it is able to more effectively inhibit the titanium atoms from the top electrode 145 from diffusing into the phase-change material pattern 140.

Figure 6A:
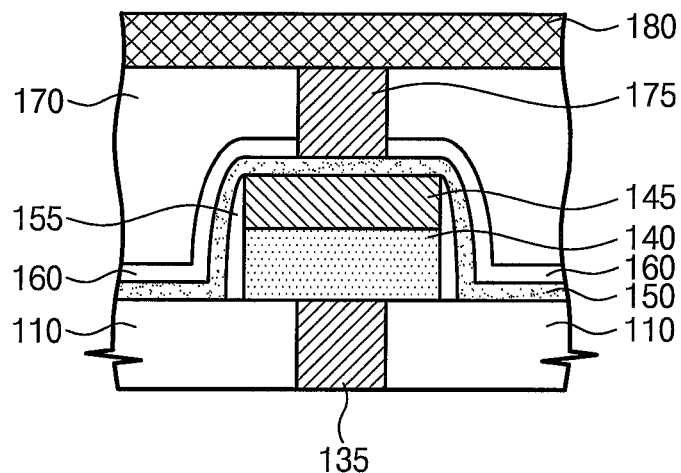
Figure 6B:
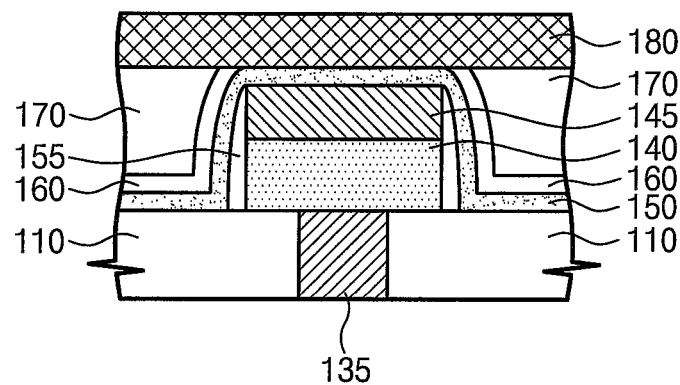

Referring to FIGS. 6A and 6B, the diffusion barrier layer 150 is formed to completely cover the phase-change material pattern 140 and the overlaying top electrode 145 as well as the surrounding substrate. Namely, the diffusion barrier layer 150 covers sidewalls of the top electrode 145 and the phase-change material pattern 140, as well as the upper surface of the top electrode 145. A spacer-type passivation layer (hereinafter, 'passivation spacer') 155 may be interposed between the diffusion barrier layer 150 and the phase-change material pattern 140. The passivation spacer 155 may comprise silicon nitride, protecting the phase-change material pattern 140.

While in this embodiment the passivation spacer 155 covers all the sidewalls of the phase-change material pattern 140 and the top electrode 145, the passivation spacer 155 may expose the sidewall of the top electrode 145. In this case, the diffusion barrier layer 150 contributes to effectively inhibit the titanium atoms of the top electrode 145 from diffusing into the phase-change material pattern 140 because it extends in a contact area with the top electrode 145. Furthermore, when the passivation spacer 155 is disposed on the sidewall of the phase-change material pattern 140, a passivation layer 160 need not be placed on the diffusion barrier layer 150.

Figure 7A:
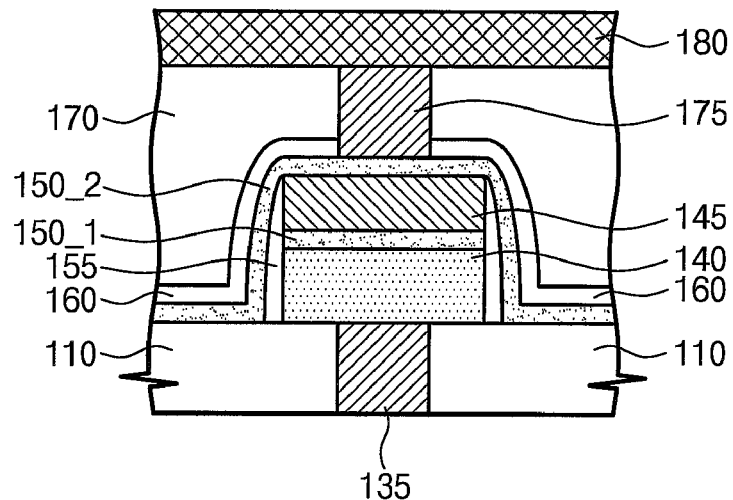
Figure 7B:
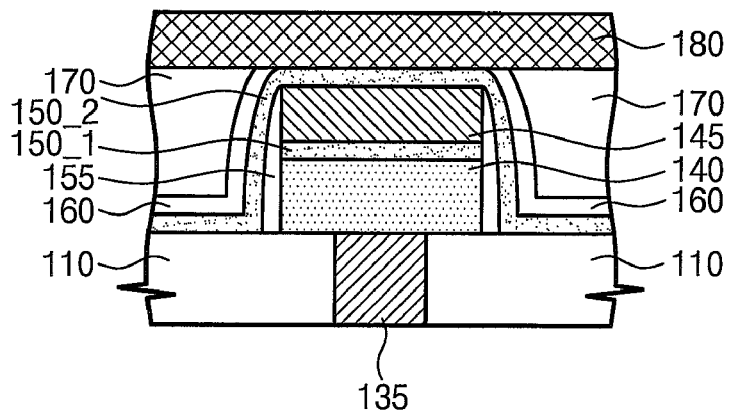

Referring to FIGS. 7A and 7B, the two diffusion barrier layers 150_1 and 150_2 are placed on and under the top electrode 145. The first diffusion barrier layer 150_1 is interposed between the phase-change material pattern 140 and the top electrode 145, while the second diffusion barrier layer 150_2 is laid on the top electrode 145. The second diffusion barrier layer 150_2 covers sidewalls of the top electrode 145 and the phase-change material pattern 140, as well as the upper surface of the top electrode 145.

In this embodiment, since the diffusion barrier layers, 150_1 and 150_2, are placed on and under the top electrode 145, it is able to more effectively inhibit diffusion of the titanium atoms from top electrode 145 into the phase-change material pattern 140.

Also in this embodiment, as with the former embodiment, the passivation spacer 155 may be interposed between the diffusion barrier layer 150 and the phase-change material pattern 140. Further, while the passivation spacer 155 covers all the sidewalls of the phase-change material pattern 140 and the top electrode 145, the passivation spacer 155 may expose the sidewall of the top electrode 145. The passivation spacer 155 may comprise silicon nitride, protecting the phase-change material pattern 140.

Exemplary method(s) of fabricating phase-change memory device consistent with embodiments of the invention will now be described. FIGS. 8 through 12 are sectional views exemplarily illustrating a procedure of fabricating a phase-change memory device in accordance with an embodiment of the invention.

Figure 8:
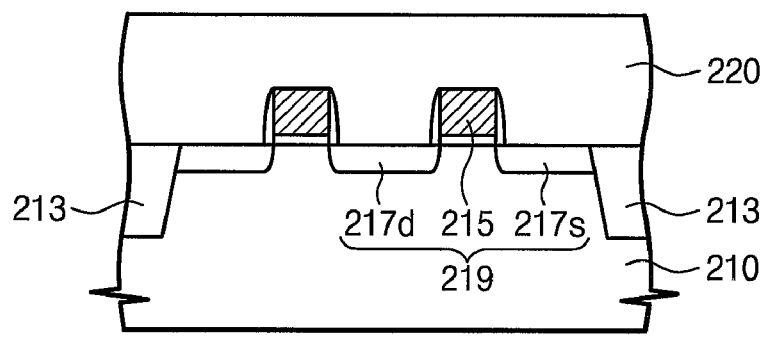
FIGS. 8 through 12 are sectional views illustrating a procedure of fabricating a phase-change memory device in accordance with an embodiment of the present invention.

First, referring to FIG. 8, a device isolation region 213 and a transistor 219 are formed in a semiconductor substrate 210. The device isolation region 213 is an insulation region formed in the semiconductor substrate 210, defining active regions. The device isolation region 213 may be formed by means of a shallow trench isolation (STI) process. The transistor 219 may comprise a gate electrode 215 extending toward a predetermined direction over the semiconductor substrate 210, and source and drain regions, 217s and 217d, formed in the active region of the semiconductor substrate 210 at both sides of the gate electrode 215. The active region between the source and drain regions 217s and 217d, i.e., the active region under the gate electrode 215, is a channel region that acts as a current path between the source and drain regions 217s and 217d. A gate insulation layer is interposed between the gate electrode 215 and the channel region. Subsequently, a first interlevel insulation layer 220 is formed to completely cover the transistor 219. The first interlevel insulation layer 220 may be formed of silicon oxide by means of a process of chemical vapor deposition (CVD).

Figure 9:
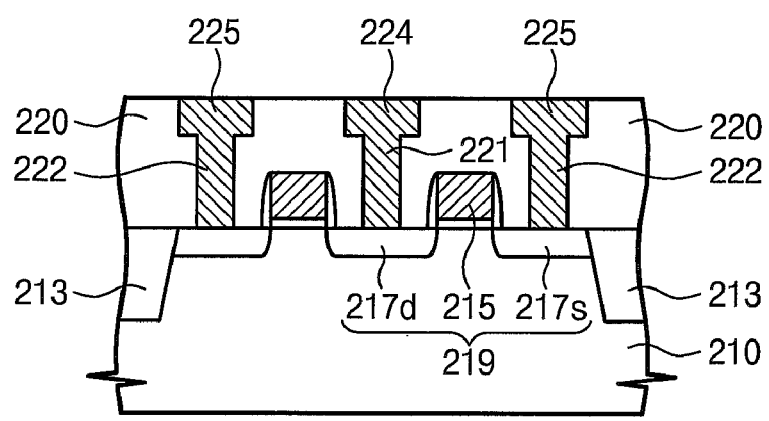

Next, referring to FIG. 9, a contact plug 221 and a lower interconnection 224 are formed on the drain region 217d, while a contact plug 222 and a bottom electrode 225 are formed on the source region 217s. The lower interconnection 224 may extend in parallel with the gate electrode 215. The contact plugs 221 and 222 may be formed of a conductive material by means of various processing ways, e.g., a dual damascene process.

Figure 10:
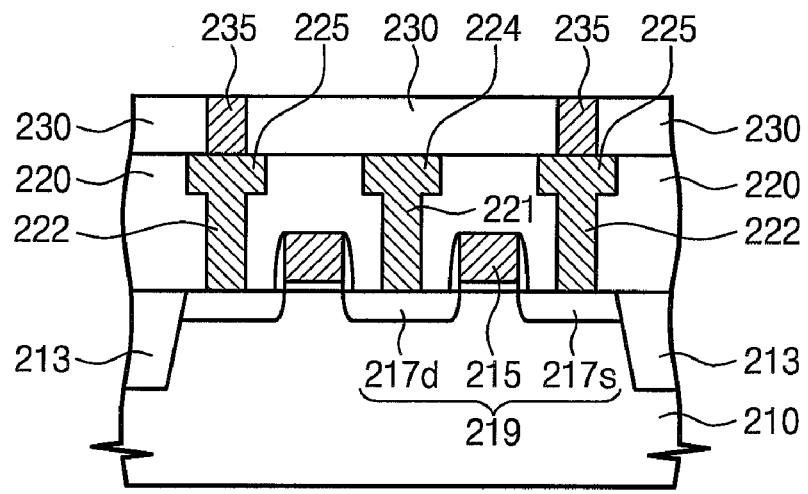

Then, referring to FIG. 10, a second interlevel insulation layer 230 is formed on the lower interconnection 224, the bottom electrode 225, and the first interlevel insulation layer 220. The second interlevel insulation layer 230 may be formed of silicon oxide by means of CVD. Continuously, a bottom electrode contact 235 is formed to contact with the bottom electrode 230, penetrating the second interlevel insulation layer 230. The width of the bottom electrode contact 235 may be smaller than the width of the bottom electrode 225.

Figure 11:
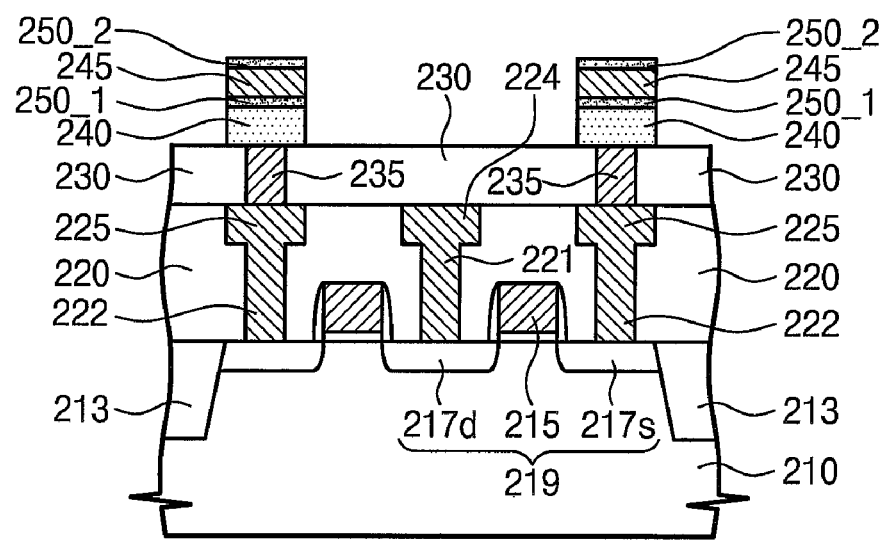

Next, referring to FIG. 11, a phase-change material layer, a first diffusion barrier material layer, a top electrode layer and a second diffusion barrier material layer are formed in sequence on the bottom electrode contact 235 and the second interlevel insulation layer 230 and then patterned by an etch process to form a phase-change material pattern 240, a first diffusion barrier layer 250_1, a top electrode 245, and a second diffusion barrier layer 250_2. The phase-change material pattern 240 contacts with the bottom electrode contact 235. The phase-change material pattern 240 may be formed of a chalcogenide containing germanium (Ge), antimony (Sb), and tellurium (Te), e.g., $Ge_2Sb_2Te_5$. The first and second diffusion barrier layers 250_1 and 250_2 may be formed of a conductive material with containing tellurium (Te), e.g., TiTe2. The top electrode 245 may be formed of a conductive material containing titanium, e.g., one of Ti, TiN, TiSiN, TiAlN, TiBN, TiON, and TiAlON.

In the illustrated embodiment, while the diffusion barrier layer 250_1 and 250_2 are formed on and under the top electrode 245, it is permissible to form a single diffusion barrier layer thereon.

Figure 12:
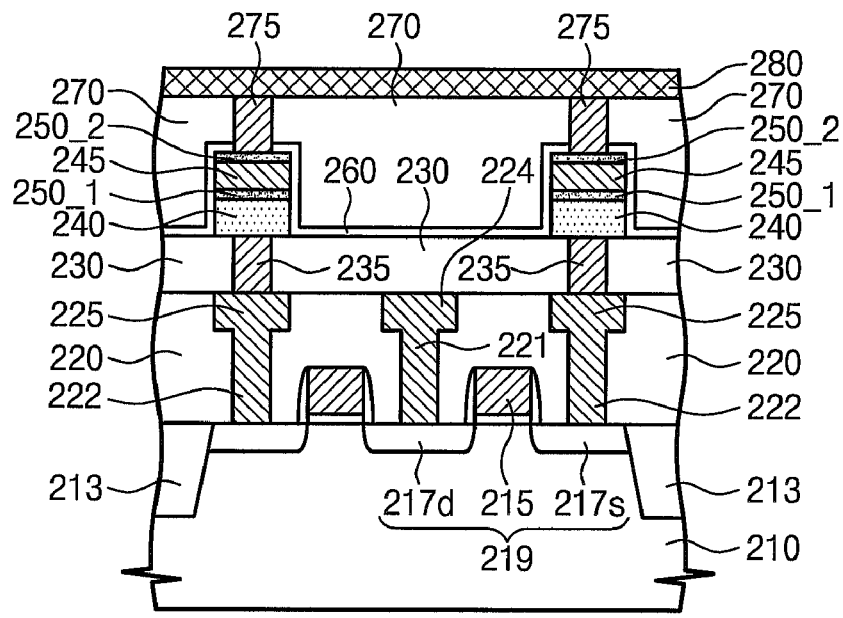

Next, referring to FIG. 12, a passivation layer 260 and a third interlevel insulation layer 270 are formed on the semiconductor substrate. Continuously, a top electrode contact 275 is formed to contact with the second diffusion barrier layer 250_2, penetrating the third interlevel insulation layer 270 and the passivation layer 260. A conductive layer is formed on the top electrode contact 275 and the third interlevel insulation layer 270, and then patterned to form an upper interconnection 280 contacting with the top electrode contact 275. The upper interconnection 280 is electrically connected to the top electrode 245 through the top electrode contact 275.

Figure 13:
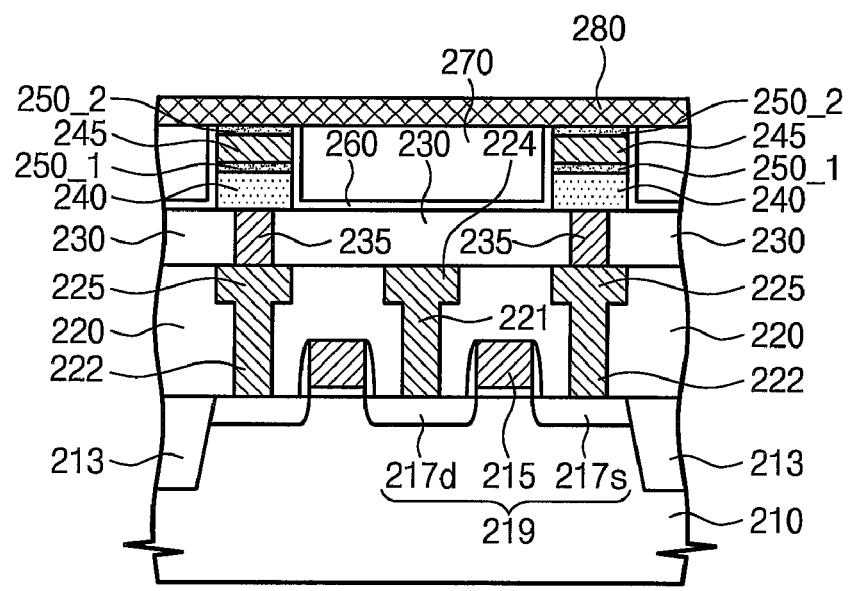
FIG. 13 is a sectional view illustrating a method of fabricating a phase-change memory device in accordance with another embodiment of the present invention.

FIG. 13 is a sectional view illustrating a method of fabricating a phase-change memory device in accordance with another embodiment of the invention.

Referring to FIG. 13, the passivation layer 260 and the third interlevel insulation layer 270 are formed on the semiconductor substrate shown in FIG. 11. Continuously, a planarization process is carried out to partially remove the third interlevel insulation layer 270 and the passivation layer 260, and expose the second diffusion barrier layer 250_2. The conductive layer is formed on the second diffusion barrier layer 250_2 and the third interlevel insulation layer 270, and then patterned to form the upper interconnection 280 contacting with the second diffusion barrier layer 250_2.

In this embodiment, different from the former embodiment, without forming the top electrode contact to connect the second diffusion barrier layer 250_2 to the upper interconnection 280, the second diffusion barrier layer 250_2 directly contacts with the upper interconnection 280. Thus, it is possible to reduce electrical contact resistance related to the top electrode contact.

Figure 14:
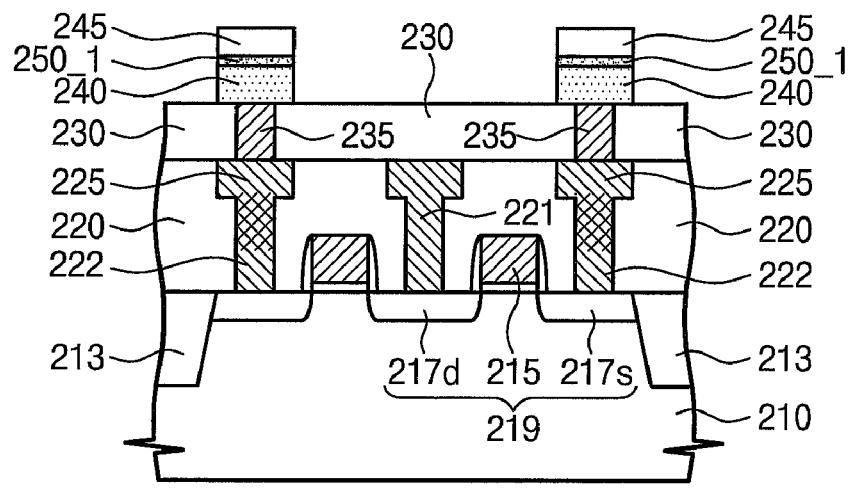
FIGS. 14 through 16 are sectional views illustrating a procedure of fabricating a phase-change memory device in accordance with another embodiment of the present invention.
Figure 15:
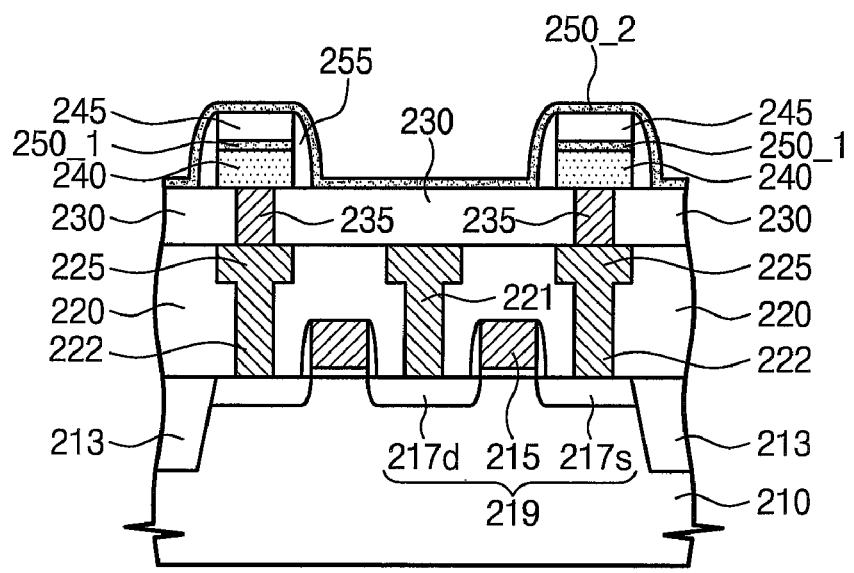
Figure 16:
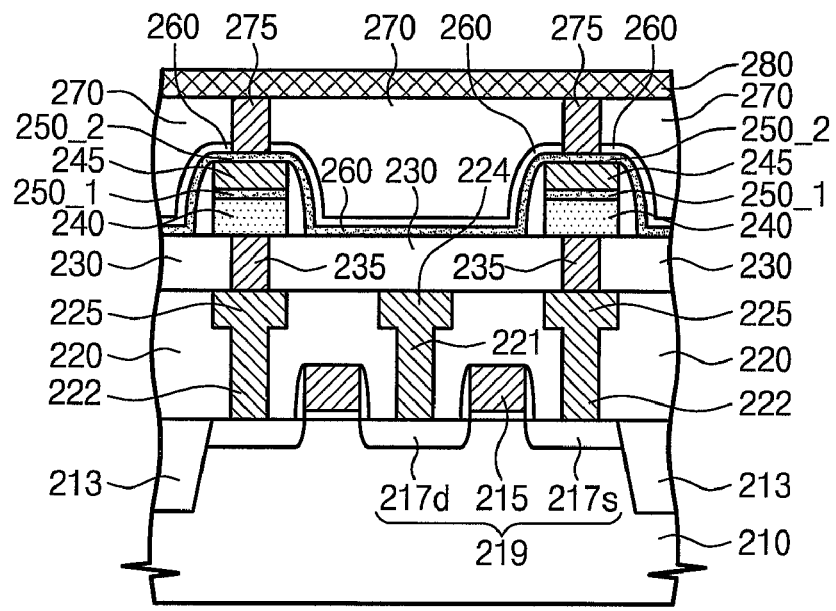

FIGS. 14 through 16 are sectional views illustrating a method of fabricating a phase-change memory device in accordance with another embodiment of the invention.

First, referring to FIG. 14, on the semiconductor substrate of FIG. 10, the phase-change material layer, the diffusion barrier material layer and the top electrode layer are formed in sequence and then patterned by an etch process to form the phase-change material pattern 240, the first diffusion barrier layer 250_1, and the top electrode 245. The phase-change material pattern 240 contacts with the bottom electrode contact 235. The phase-change material pattern 240 may be formed of a chalcogenide containing germanium (Ge), antimony (Sb), and tellurium (Te), e.g., $Ge_2Sb_2Te_5$. The first diffusion barrier layer 250_1 may be formed of a conductive material containing tellurium (Te), e.g., TiTe2. The top electrode 245 may be formed of a conductive material containing titanium, e.g., one of Ti, TiN, TiSiN, TiAlN, TiBN, TiON, and TiAlON.

Referring to FIG. 15, a passivation spacer 255 is formed to cover a sidewall of the phase-change material pattern 240. The passivation spacer 255 may be formed by performing an anisotropic etch-back process after forming an insulation layer such a silicon nitride layer on the semiconductor substrate. Continuously, the second diffusion barrier layer 250_2 is formed on the substrate. The second diffusion barrier layer 250_2 may be formed of a conductive material containing tellurium (Te), e.g., $TiTe_2$.

In this embodiment, whereas the passivation spacer 255 covers the sidewall of the top electrode 245, conditional parameters of the etch process can be controlled to make the passivation spacer 255 cover the sidewall of the phase-change material pattern 240 but expose the sidewall of the top electrode 245. Further, whereas the diffusion barrier layers 250_1 and 250_2 are formed respectively on and under the top electrode 245, it is permissible to form a single diffusion barrier layer thereon.

Referring to FIG. 16, the passivation layer 260 and the third interlevel insulation layer 270 are formed on the semiconductor substrate. As illustrated in FIG. 15, if the passivation spacer 255 is formed on the phase-change material pattern 240, the passivation layer 260 may not be provided thereto. Continuously, the top electrode contact 275 is formed to contact with the second diffusion barrier layer 250_2, penetrating the passivation layer 260 and the third interlevel insulation layer 270. The conductive layer is formed on the top electrode contact 275 and the third interlevel insulation layer 270, and then patterned to form the upper interconnection 280 contacting with the top electrode contact 275. The upper interconnection 280 is electrically connected to the top electrode 245 by way of the top electrode contact 275.

Figure 17:
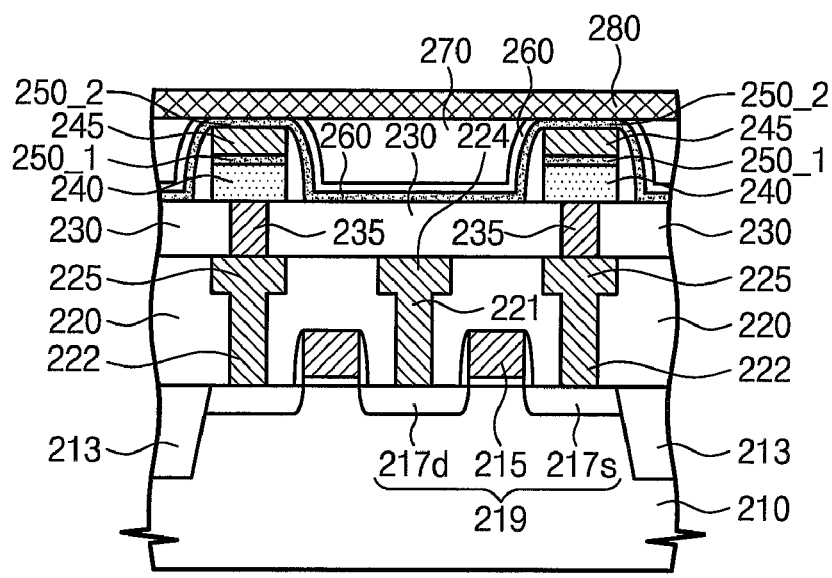
FIG. 17 is a sectional view illustrating a method of fabricating a phase-change memory device in accordance with another embodiment of the present invention.

FIG. 17 is a sectional view illustrating a method of fabricating a phase-change memory device in accordance with another embodiment of the invention.

Referring to FIG. 17, the passivation layer 260 and the third interlevel insulation layer 270 are formed on the semiconductor substrate shown in FIG. 15. Continuously, a planarization process is carried out to partially remove the third interlevel insulation layer 270 and the passivation layer 260, and expose the second diffusion barrier layer 250_2. The conductive layer is formed on the second diffusion barrier layer 250_2 and the third interlevel insulation layer 270, and then patterned to form the upper interconnection 280 contacting with the second diffusion barrier layer 250_2.

In this embodiment, without forming the top electrode contact to connect the second diffusion barrier layer 250_2 to the upper interconnection 280, the second diffusion barrier layer 250_2 directly contacts with the upper interconnection 280. Thus, it is possible to reduce electrical contact resistance related to the top electrode contact.

According to the embodiments of the present invention, it is possible to effectively inhibit titanium atoms from a top electrode (or similar element) from diffusing into a phase-change material pattern of a phase-change memory device. This ability allows the material composition of the phase-change material pattern to be maintained at a constant ratio even when the phase-change memory device repeatedly performs read/write operations. Thus, the reliability and performance characteristics of the phase-change memory device may be improved.

The foregoing subject matter should be considered illustrative, and not restrictive, and the appended claims are intended to cover all modifications, enhancements, and related embodiments, which fall within their scope. Thus, to the maximum extent allowed by law, the scope of the invention is to be determined by the broadest permissible interpretation of the following claims and their equivalents, and shall not be restricted or limited by the foregoing detailed description.

What is claimed is:

1. A phase-change memory device comprising:
   a phase-change material pattern;
   first and second electrodes providing an electrical signal to the phase-change material pattern; and
   a diffusion barrier layer comprising tellurium and contacting the first electrode to thereby inhibiting atomic diffusion from the first electrode into the phase-change material pattern.

2. The phase-change memory device as set forth in claim 1, wherein the first electrode comprises titanium.

3. The phase-change memory device as set forth in claim 2, wherein the diffusion barrier layer contacts with at least one of the top and bottom of the first electrode.

4. The phase-change memory device as set forth in claim 2, wherein the diffusion barrier layer comprises $TiTe_2$.

5. A phase-change memory device comprising:
   a bottom electrode in a semiconductor substrate;
   a phase-change material pattern on the bottom electrode;
   a first diffusion barrier layer comprising tellurium on the phase-change material pattern; and
   a top electrode comprising titanium on the first diffusion barrier layer,
   wherein the first diffusion barrier layer inhibits diffusion of titanium from the top electrode into the phase-change material pattern.

6. The phase-change memory device as set forth in claim 5, further comprising a second diffusion barrier layer comprising tellurium on the top electrode.

7. The phase-change memory device as set forth in claim 6, wherein the first and second diffusion barrier layers comprise $TiTe_2$.

8. The phase-change memory device as set forth in claim 6, wherein the second diffusion barrier layer covers sidewalls of the top electrode and the phase-change material pattern.

9. The phase-change memory device as set forth in claim 5, further comprising a passivation layer covering a sidewall of the phase-change material pattern.

10. A phase-change memory device comprising:
   a bottom electrode in a semiconductor substrate;
   a phase-change material pattern on the bottom electrode;
   a top electrode comprising titanium on the phase-change material pattern; and
   a diffusion barrier layer comprising tellurium on the top electrode, wherein the diffusion barrier layer inhibits diffusion of titanium from the top electrode into the phase-change material pattern.

11. The phase-change memory device as set forth in claim 10, wherein the diffusion barrier layer includes $TiTe_2$.

12. The phase-change memory device as set forth in claim 10, wherein the diffusion barrier layer covers sidewalls of the top electrode and the phase-change material pattern.

13. The phase-change memory device as set forth in claim 10, further comprising a passivation layer covering a sidewall of the phase-change material pattern.

* * * * *